(12) United States Patent
Obata et al.

(10) Patent No.: US 12,365,985 B2
(45) Date of Patent: Jul. 22, 2025

(54) DEPOSITION APPARATUS WITH PRESSURE SENSOR AND SHOWER HEAD ON SAME PLANE AND DEPOSITION METHOD

(71) Applicant: Tokyo Electron Limited, Tokyo (JP)

(72) Inventors: Yuji Obata, Yamanashi (JP);
Tsuneyuki Okabe, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 17/455,970

(22) Filed: Nov. 22, 2021

(65) Prior Publication Data
US 2022/0178029 A1  Jun. 9, 2022

(30) Foreign Application Priority Data

Dec. 3, 2020 (JP) .................................. 2020-201241
Sep. 28, 2021 (JP) .................................. 2021-157838

(51) Int. Cl.
*C23C 16/455* (2006.01)
*C23C 16/34* (2006.01)

(52) U.S. Cl.
CPC .. *C23C 16/45557* (2013.01); *C23C 16/45544* (2013.01); *C23C 16/45565* (2013.01); *C23C 16/34* (2013.01)

(58) Field of Classification Search
CPC ........ C23C 16/45565; C23C 16/45561; C23C 16/52; C23C 16/45563; H01J 37/32449; B05B 1/18; B05B 1/185; C30B 25/14
USPC .............................. 427/8; 156/345.33, 345.34
See application file for complete search history.

(56) References Cited

U.S. PATENT DOCUMENTS

| 6,358,324 B1* | 3/2002 | Hongoh | C23C 16/511 118/713 |
| 6,565,661 B1* | 5/2003 | Nguyen | C23C 16/4557 118/715 |
| 7,629,033 B2* | 12/2009 | Hongo | C23C 16/4558 427/255.27 |
| 8,628,616 B2* | 1/2014 | Takasuka | C23C 16/4401 156/345.33 |
| 9,885,114 B2* | 2/2018 | Saitou | C23C 16/45565 |

(Continued)

FOREIGN PATENT DOCUMENTS

CN 110872702 3/2020
JP 2002-241943 8/2002

(Continued)

*Primary Examiner* — Karl Kurple
(74) *Attorney, Agent, or Firm* — IPUSA, PLLC

(57) ABSTRACT

A deposition apparatus includes: a decompressable process container; a showerhead configured to supply a gas in the process container, the showerhead including a lower member having a plurality of gas holes and an upper member that forms, between the upper member and the lower member, a diffusion space that diffuses the gas; a mounting table arranged to face the showerhead and to form a process space between the mounting table and the showerhead; a lifting and lowering mechanism configured to lift and lower the mounting table; a cylindrical section that penetrates the showerhead and communicates with the process space; and a pressure sensor that is airtightly provided in the cylindrical section and configured to measure a pressure in the process space.

8 Claims, 9 Drawing Sheets

(56) References Cited

U.S. PATENT DOCUMENTS

| | | | | |
|---|---|---|---|---|
| 2004/0011292 A1* | 1/2004 | Shimizu | ................. | C23C 16/52 |
| | | | | 118/723 VE |
| 2007/0144671 A1* | 6/2007 | Ohmi | ................ | C23C 16/45565 |
| | | | | 156/345.33 |
| 2007/0254113 A1* | 11/2007 | Hongo | ................ | C23C 16/4412 |
| | | | | 427/579 |
| 2009/0183683 A1* | 7/2009 | Kobayashi | .......... | C23C 16/4401 |
| | | | | 118/723 R |
| 2011/0308453 A1* | 12/2011 | Su | ..................... | C23C 16/481 |
| | | | | 118/708 |
| 2012/0073753 A1* | 3/2012 | Satoh | ............... | C23C 16/45563 |
| | | | | 156/345.33 |
| 2013/0205907 A1* | 8/2013 | Fukano | .............. | G01L 19/0038 |
| | | | | 73/715 |
| 2014/0158786 A1* | 6/2014 | Santo | ................ | C23C 16/45565 |
| | | | | 239/548 |
| 2015/0047567 A1* | 2/2015 | Saitou | ................... | C23C 16/34 |
| | | | | 118/729 |
| 2015/0267298 A1* | 9/2015 | Saitou | ................. | C23C 16/45544 |
| | | | | 118/725 |
| 2015/0375994 A1* | 12/2015 | Chien | ................. | B81C 1/00238 |
| | | | | 257/43 |
| 2016/0322200 A1* | 11/2016 | Alayavalli | .......... | C23C 16/4404 |
| 2016/0362813 A1* | 12/2016 | Bao | ................... | H01L 21/02293 |
| 2018/0337023 A1* | 11/2018 | Ikeda | ................ | C23C 16/45563 |
| 2019/0145002 A1* | 5/2019 | Um | ................... | C23C 16/45557 |
| | | | | 118/722 |
| 2019/0273004 A1* | 9/2019 | Ueda | ................. | H01L 21/67017 |
| 2020/0071831 A1* | 3/2020 | Kuwada | ............. | H01L 21/0228 |
| 2021/0043425 A1* | 2/2021 | Sawachi | .......... | C23C 16/45574 |

FOREIGN PATENT DOCUMENTS

| | | | | |
|---|---|---|---|---|
| JP | 2005-033167 | 2/2005 | | |
| JP | 2013-040398 | 2/2013 | | |
| JP | 2013040398 A | * 2/2013 | ............ | C23C 16/44 |
| JP | 2015-175060 | 10/2015 | | |
| JP | 2018-066050 | 4/2018 | | |
| JP | 2020-161596 | 10/2020 | | |
| KR | 10-2015-0108780 | 9/2015 | | |

* cited by examiner

DEPOSITION APPARATUS WITH PRESSURE SENSOR AND SHOWER HEAD ON SAME PLANE AND DEPOSITION METHOD

CROSS-REFERENCE TO RELATED APPLICATION

The present application is based upon and claims priority to Japanese Patent Application No. 2020-201241, filed on Dec. 3, 2020, and Japanese Patent Application No. 2021-157838, filed on Sep. 28, 2021, and the entire contents of these applications are incorporated herein by reference.

BACKGROUND

1. Field

The present disclosure relates to a deposition apparatus and a deposition method.

2. Background Art

A deposition apparatus having a pressure sensor for measuring the pressure in a process container is known (see, for example, Patent Documents 1 and 2). In addition, an atomic layer deposition (ALD) apparatus is known in which a diffusion space is formed between a mounting table and a showerhead in a process container to improve gas displacement and perform a process (see, for example, Patent Document 3).

PRIOR ART DOCUMENTS

Patent Documents

[Patent Document 1] Japanese Laid-open Patent Publication No. 2002-241943
[Patent Document 2] Japanese Laid-open Patent Publication No. 2013-040398
[Patent Document 3] Japanese Laid-open Patent Publication No. 2015-175060

The present disclosure provides a technique that enables to measure pressure in the vicinity of a substrate with high accuracy.

SUMMARY

According to one aspect of the present disclosure, a deposition apparatus includes: a decompressable process container; a showerhead configured to supply a gas in the process container, the showerhead including a lower member having a plurality of gas holes and an upper member that forms, between the upper member and the lower member, a diffusion space that diffuses the gas; a mounting table arranged to face the showerhead and to form a process space between the mounting table and the showerhead; a lifting and lowering mechanism configured to lift and lower the mounting table; a cylindrical section that penetrates the showerhead and communicates with the process space; and a pressure sensor that is airtightly provided in the cylindrical section and configured to measure a pressure in the process space.

According to the present disclosure, it is possible to measure pressure in the vicinity of a substrate with high accuracy.

DESCRIPTION OF THE EMBODIMENTS

Figure 1:
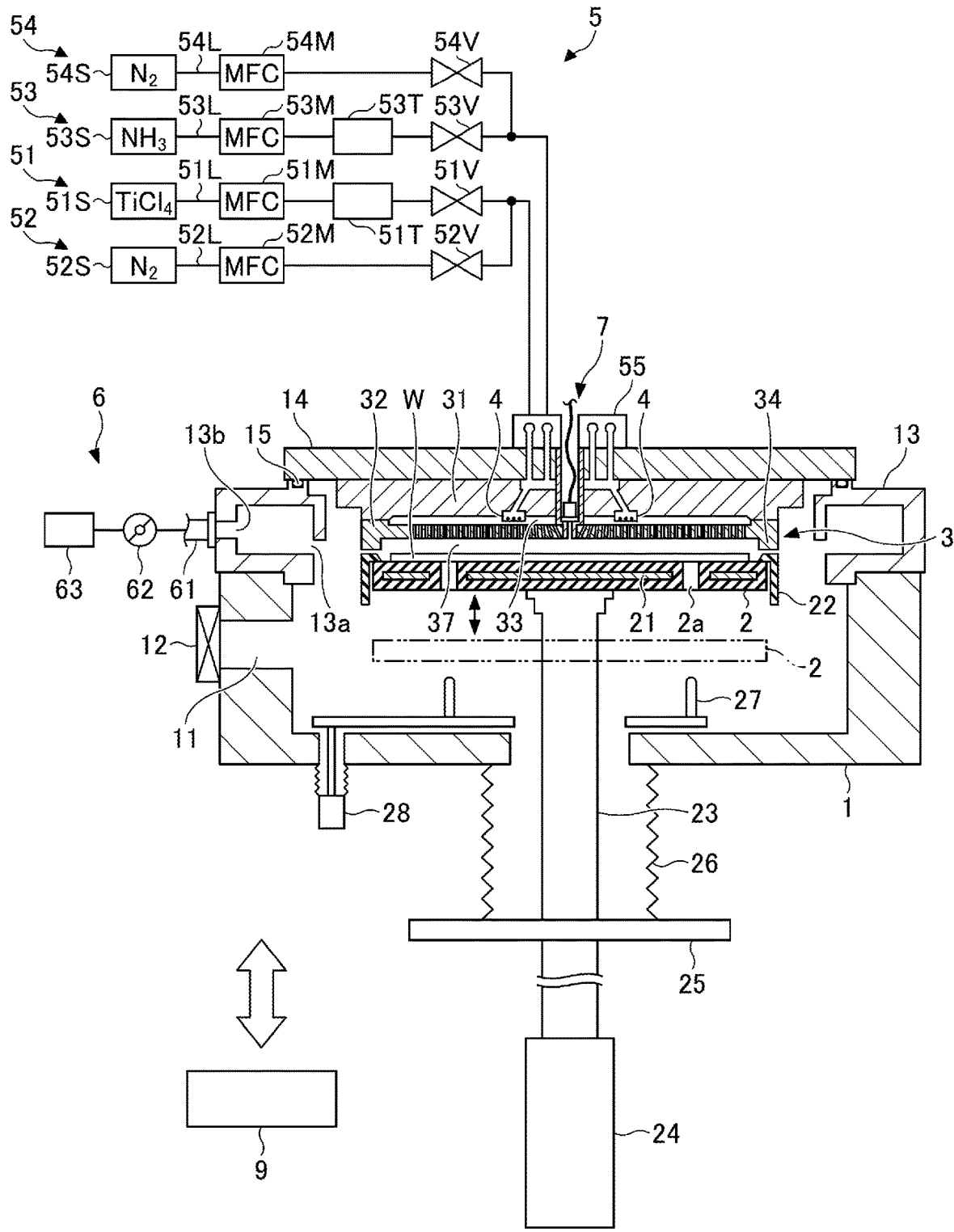
FIG. 1 is a cross-sectional view illustrating an example of a deposition apparatus according to a first embodiment.

In the following, non-limiting exemplary embodiments of the present disclosure will be described with reference to the accompanying drawings. In all the accompanying drawings, the same or corresponding reference numerals shall be attached to the same or corresponding components and overlapping descriptions may be omitted.

First Embodiment (Deposition Apparatus)

Referring to FIG. 1 to FIG. 6, an example of a deposition apparatus according to a first embodiment will be described. A deposition apparatus 100 according to the first embodiment is configured as an apparatus that can execute deposition by an atomic layer deposition (ALD) method.

The deposition apparatus 100 includes a process container 1, a mounting table 2, a showerhead 3, gas supply sections 4, a gas introduction section 5, an exhaust section 6, a pressure measuring section 7, a controller 9, and the like.

The process container 1 is a vacuum container capable of decompressing the inside. The process container 1 is made of a metal such as aluminum and has a generally cylindrical shape. The process container 1 accommodates a semiconductor wafer (hereinafter referred to as "wafer W"), which is an example of a substrate. The side wall of the process container 1 is provided with an inlet/outlet 11 for carrying in and carrying out the wafer W. The inlet/outlet 11 is opened and closed by a gate valve 12. An annular exhaust duct 13 having a rectangular cross-section is provided on the body of the process container 1. A slit 13a is formed in the exhaust duct 13 along the inner peripheral surface. An exhaust port 13b is formed in the outer wall of the exhaust duct 13. A top plate member 14 is provided on the upper surface of the exhaust duct 13 so as to close the upper opening of the process container 1. The exhaust duct 13 and the top plate member 14 are hermetically sealed by a seal ring 15.

The mounting table 2 horizontally supports the wafer W in the process container 1. The mounting table 2 has a disc shape larger than the wafer W and is composed of a ceramic material such as aluminum nitride (AlN) or a metallic material such as aluminum or nickel alloy. Inside the mounting table 2, a heater 21 for heating the wafer W is embedded. The heater 21 is powered and generates heat from a heater power supply (not illustrated). The wafer W is controlled to a predetermined temperature by controlling the output of the heater 21 by a temperature signal of a thermocouple (not illustrated) provided in the vicinity of the upper surface of the mounting table 2. The mounting table 2 is provided with a cover member 22 formed of a ceramic material such as alumina so as to cover the outer peripheral area of the upper surface and the side surface.

The mounting table 2 is supported on a support member 23. The support member 23 extends from the center of the bottom surface of the mounting table 2 to penetrate a hole formed in the bottom wall of the process container 1 to extend below the process container 1, and its lower end is connected to a lifting and lowering mechanism 24. The mounting table 2 is lifted and lowered by the lifting and lowering mechanism 24 between a process position illustrated in FIG. 1 and a transport position where the wafer W can be transported by the double-dotted line below the process position. Below the process container 1 of the support member 23 is a flange section 25 is attached. A bellows 26 is provided between the bottom surface of the process container 1 and the flange section 25. The bellows 26 partitions the atmosphere in the process container 1 from the outside air and expands and contracts with the lifting and lowering operation of the mounting table 2.

Near the bottom surface of the process container 1, three wafer support pins 27 (only two of which are illustrated) are provided to protrude upwardly from a lifting and lowering plate. The wafer support pins 27 are lifted and lowered via the lifting and lowering plate by a lifting and lowering mechanism 28 provided below the process container 1. The wafer support pins 27 can be inserted in through holes 2a provided in the mounting table 2 at a transport position and can protrude and retract with respect to the upper surface of the mounting table 2. By lifting and lowering the wafer support pins 27, the wafer W is transferred between a transport robot (not illustrated) and the mounting table 2.

The showerhead 3 supplies a process gas into the process container 1 in the form of a shower. The showerhead 3 is formed, for example, of a metallic material and is disposed to face the mounting table 2. The showerhead 3 has a diameter approximately the same as the mounting table 2. The showerhead 3 includes an upper member 31 and a lower member 32. The upper member 31 is secured to the lower surface of the top plate member 14. The lower member 32 is connected to the bottom of the upper member 31. A diffusion space 33 is formed between the upper member 31 and the lower member 32 to diffuse gas. The diffusion space 33 is provided with a gas introduction path 36 so as to penetrate the top plate member 14 and the upper member 31. A gas is introduced into the gas introduction path 36 from the gas introduction section 5 through an inlet block 55, which will be described later. The peripheral section of the lower member 32 is formed with a downwardly protruding annular protrusion 34. A large number of gas holes 35 are formed on the flat surface inside the annular protrusion 34 in the lower member 32. In a state in which the mounting table 2 moves to the process position, a narrow process space 37 is formed between the mounting table 2 and the lower member 32, and the upper surface of the cover member 22 and the annular protrusion 34 are in close proximity with each other to form an annular clearance 38.

The large number of gas holes 35 include a plurality of inclined holes 35a and a plurality of non-inclined holes 35b. The plurality of inclined holes 35a are disposed around a cylindrical section 71, which will be described below, and are inclined in the central direction of the cylindrical section 71 from the diffusion space 33 side toward the process space 37 side. It is preferable that the plurality of inclined holes 35a are arranged so that the inclination angle increases in accordance with proximity to the center of the cylindrical section. Thereby, because the gas is also discharged to below the cylindrical section 71 where the gas holes 35 are not disposed, the in-plane uniformity is enhanced. The plurality of non-inclined holes 35b are disposed around the plurality of inclined holes 35a and do not have an inclination from the diffusion space 33 side toward the process space 37 side.

For example, eight gas supply sections 4 are provided in the diffusion space 33. The eight gas supply sections 4 are arranged so as to surround the center of the showerhead 3 circularly at equally intervals. The number of the gas supply sections 4 provided in the diffusion space 33 is not limited to eight. For example, if at least two, preferably three or more, gas supply sections 4 are provided at locations away from each other on a ring surrounding the center of the showerhead 3, the gas can be uniformly supplied into the showerhead 3 in a short period of time. The shape of the ring where the plurality of gas supply sections 4 are provided is not limited to a circular ring. For example, the plurality of gas supply sections 4 may be disposed on a rectangular ring.

Figure 4:
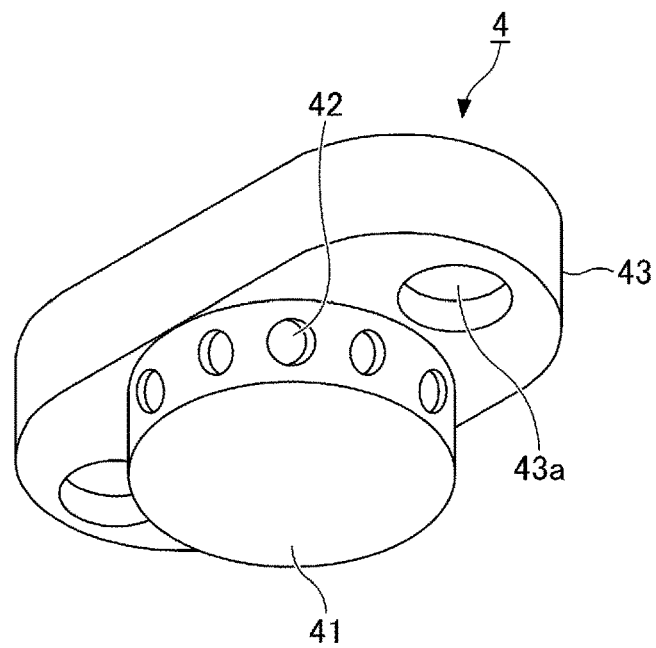
FIG. 4 is a perspective view of a gas supply section of the deposition apparatus of FIG. 1.
Figure 5:
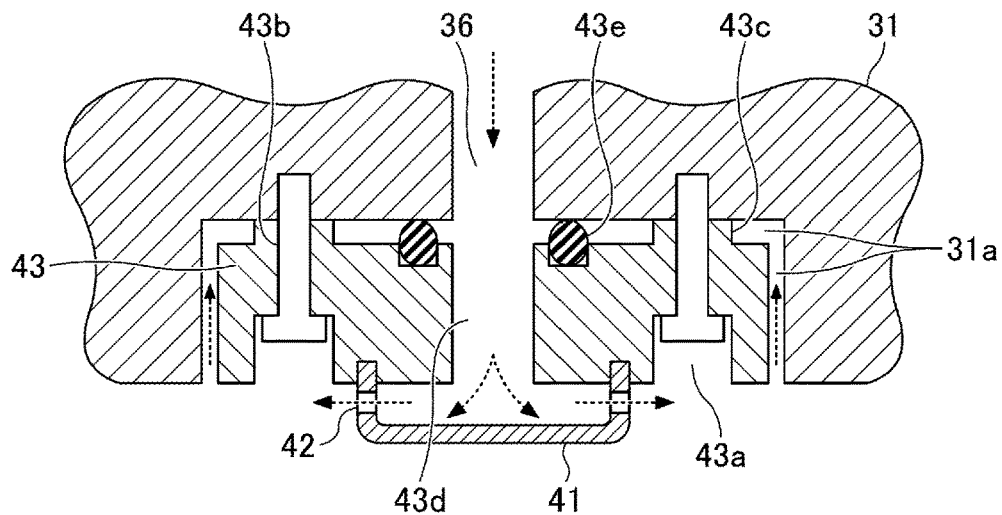
FIG. 5 is a longitudinal cross-sectional view of the gas supply section of the deposition apparatus of FIG. 1.
Figure 6:
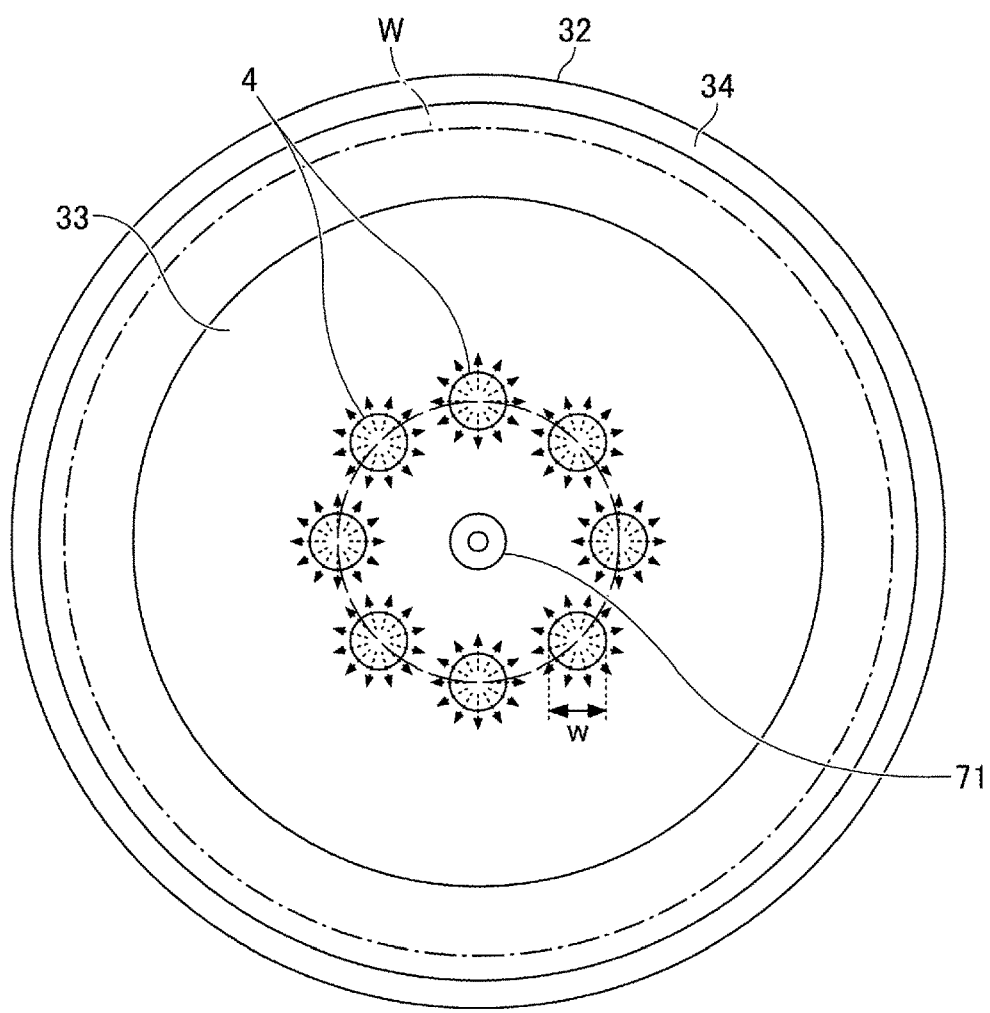
FIG. 6 is a diagram of a showerhead of the deposition apparatus of FIG. 1 viewed from below.

Each gas supply section 4, as illustrated in FIG. 4 and FIG. 5, includes a base 43 fastened to the upper member 31 and a hollow head 41 inside of which is disposed on the lower surface side of the base 43. A recess into which the base 43 is inserted is formed on the lower surface of the upper member 31, and when the base 43 is fitted into the recess, the head 41 is in a state of protruding from the lower surface of the upper member 31 into the diffusion space 33.

Screw holes 43a are formed on the base 43. Screws 43b are screwed into the screw holes 43a and screw holes formed in the recesses on the upper member 31 side to fasten the base 43 to the upper member 31.

When a process gas enters between the base 43 and the upper member 31 to deposit a film and when the base 43 and the upper member 31 are fixed, particles may be generated when the gas supply section 4 is removed. Therefore, the base 43 of the present embodiment is configured to be able to suppress the generation of such particles.

As illustrated in FIG. 5, the base 43 is formed to be one size smaller than the recess on the upper member 31 side. A clearance 31a of, for example, about 0.1 mm to 1 mm is formed between the outer peripheral surface of the base 43 and the inner peripheral surface of the recess on the upper member 31 side. Further, a flattened ring-shaped protrusion 43c protrudes upward from the upper end of the screw holes 43a in the base 43. The base 43 contacts the upper member 31 via a contact surface on the upper surface side of the protrusion 43c, and a clearance 31a is also formed between the upper surface of the base 43 and the lower surface of the recess on the upper member 31 side to the same extent as the side surface side.

In addition, the base 43 is provided with a gas path 43d that communicates with the gas introduction path 36 formed in the upper member 31 so as to penetrate the base 43 in the vertical direction. Around the opening at the upper end side of the gas path 43d, an O-ring 43e that is a packing member for airtightly connecting the gas introduction path 36 and the gas path 43d is provided.

As a result, the portions that contact the upper member 31 are limited to the contact surface on the upper surface side of the protrusion 43c and the O-ring 43e, while in other portions, a relatively large clearance 31a is formed between the base 43 and the upper member 31. Therefore, even when a film is formed by the penetration of a process gas between the base 43 and the upper member 31, the base 43 and the upper member 31 do not easily stick to each other. As a result, it is possible to suppress the generation of particles when the gas supply section 4 is removed.

Also, the portions that contact the upper member 31 are limited to the contact surface on the upper surface side of the protrusion 43c and the O-ring 43e, and these contact portions are provided on the upper surface side of the base 43 far from an entry position of a reactive gas. Therefore, the reactive gas does not easily enter between the contact surface of the protrusion 43c or the O-ring 43e and the upper member 31. Also, even if the reactive gas enters, its area is small. As a result, it is possible to suppress the generation of particles in removing the gas supply section 4 or the like.

The head 41 is provided so as to cover the opening on the lower end side of the gas path 43d from the lower side of the base 43, and may be, for example, a flattened cylindrical cover having a diameter in the range of 8 mm to 20 mm, which may be, for example, 20 mm. A plurality of gas discharge ports 42 are formed on the side surface of the head 41 with intervals along the circumferential direction. For example, three or more gas discharge ports 42 are preferably provided for each head 41, and twelve gas discharge ports 42 are provided in this example. Further, because the lower surface of the head 41 is closed and gas discharge ports 42 are not provided on the lower surface, the gas flowing into the head 41 is discharged uniformly from each gas discharge port 42 in the horizontal direction.

As described above, the gas supply sections 4 are configured to spread the gas uniformly in the circumferential direction. The gas discharged from the gas discharge ports 42 of the gas supply sections 4 is supplied through the gas holes 35 to the process space 37 after being sufficiently spread in the showerhead 3. As a result, the gas is uniformly supplied to the surface of the wafer W on the mounting table 2.

The gas introduction section 5 supplies various kinds of gases to the showerhead 3. The gas introduction section 5 includes a raw material gas supply section 51, a first purge gas supply section 52, a nitride gas supply section 53, a second purge gas supply section 54, and an inlet block 55.

The raw material gas supply section 51 includes a raw material gas source 51S, a gas supply line 51L, a flow controller 51M, a storage tank 51T and a valve 51V. The raw material gas source 51S supplies titanium chloride gas ($TiCl_4$), which is an example of a raw material gas, through the gas supply line 51L into the process container 1. The gas supply line 51L is a line extending from the raw material gas source 51S. The gas supply line 51L is connected to the inlet block 55. The gas supply line 51L is provided with the flow controller 51M, the storage tank 51T, and the valve 51V in order from the raw material gas source 51S side. The flow controller 51M controls the flow rate of $TiCl_4$ that flows through the gas supply line 51L. The flow controller 51M may be, for example, a mass flow controller (MFC). The storage tank 51T temporarily stores $TiCl_4$. By providing the storage tank 51T, a high flow rate of $TiCl_4$ can be supplied into the process container 1 in a short time. The storage tank 51T is also referred to as a buffer tank or a filter tank. The valve 51V is a valve for switching supply and stop of gas at the time of ALD. The valve 51V may be an ALD valve capable of opening and closing at high speed, for example. Preferably, the ALD valve can be opened and closed at intervals of 0.01 seconds to 1.0 seconds.

The first purge gas supply section 52 includes a purge gas source 52S, a gas supply line 52L, a flow controller 52M and a valve 52V. The purge gas source 52S supplies nitrogen gas ($N_2$), which is an example of purge gas, through the gas supply line 52L into the process container 1. The gas supply line 52L is a line extending from the purge gas source 52S. The gas supply line 52L is connected to the gas supply line 51L. The gas supply line 52L is provided with the flow controller 52M and the valve 52V in order from the purge gas source 52S side. The flow controller 52M controls the flow rate of $N_2$ that flows through the gas supply line 52L. The flow controller 52M may be, for example, a mass flow controller. The valve 52V is a valve for switching supply and stop of gas at the time of ALD. The valve 52V may be an ALD valve capable of opening and closing at high speed, for example. Preferably, the ALD valve can be opened and closed at intervals of 0.01 seconds to 1.0 seconds.

The nitride gas supply section 53 includes a nitride gas source 53S, a gas supply line 53L, a flow controller 53M, a storage tank 53T, and a valve 53V. The gas nitride source 53S supplies ammonia gas ($NH_3$), which is an example of a nitride gas, through the gas supply line 53L into the process container 1. The gas supply line 53L is a line extending from the nitride gas source 53S. The gas supply line 53L is connected to the inlet block 55. The gas supply line 53L is provided with the flow controller 53M, the storage tank 53T, and the valve 53V in order from the nitride gas source 53S side. The flow controller 53M controls the flow rate of NH3 that flows through the gas supply line 53L. The flow controller 53M may be, for example, a mass flow controller. The storage tank 53T temporarily stores $NH_3$. By providing the storage tank 53T, a high flow rate of $NH_3$ can be supplied into the process container 1 in a short time. The storage tank 53T is also referred to as a buffer tank or a filter tank. The valve 53V is a valve for switching 2' supply and stop of gas at the time of ALD. The valve 53V may be an ALD valve capable of opening and closing at high speed, for example. Preferably, the ALD valve can be opened and closed at intervals of 0.01 seconds to 1.0 seconds.

The second purge gas supply section 54 includes a purge gas source 54S, a gas supply line 54L, a flow controller 54M, and a valve 54V. The purge gas source 54S supplies nitrogen gas ($N_2$), which is an example of purge gas, through the gas supply line 54L into the process container 1. The gas supply line 54L is a line extending from the purge gas source 54S. The gas supply line 54L is connected to the gas supply line 53L. The gas supply line 54L is provided with the flow controller 54M and the valve 54V in order from the purge gas source 54S side. The flow controller 54M controls the flow rate of $N_2$ through the gas supply line 54L. The flow controller 54M may be, for example, a mass flow controller. The valve 54V is a valve for switching supply and stop of gas at the time of ALD. The valve 54V may be an ALD valve capable of opening and closing at high speed, for example. Preferably, the ALD valve can be opened and closed at intervals of 0.01 seconds to 1.0 seconds.

The inlet block 55 has a cylindrical shape with hollow interior and is provided on the top plate member 14. The inlet block 55 is arranged on the center of top plate member 14. The gas flow path 55a is formed within the inlet block 55. The gas flow path 55a communicates with the gas supply lines 51L and 53L and the gas introduction path 36 to supply the gas supplied from the gas supply lines 51L and 53L to the gas introduction path 36.

The exhaust section 6 depressurizes the inside of the process container 1 by exhausting the inside of the process container 1. The exhaust section 6 includes an exhaust pipe 61, a pressure controller 62, and a vacuum pump 63. The exhaust pipe 61 is connected to an exhaust port 13b. The pressure controller 62 is disposed on the exhaust pipe 61. The pressure controller 62 may be a valve that controls conductance in the exhaust pipe 61 by adjusting the opening degree, for example. The vacuum pump 63 is disposed on the exhaust pipe 61.

The pressure measuring section 7 includes a cylindrical section 71 and a pressure sensor 72. The cylindrical section 71 has a cylindrical shape with a hollow interior. The cylindrical section 71 penetrates the top plate member 14 and the showerhead 3 in the thickness direction and communicates with the process space 37. The cylindrical section 71 is provided at the center of the top plate member 14. Thus, in a plan view, the hollow section of the cylindrical section 71 and the hollow section of the inlet block 55 communicate with each other. A pressure sensor 72 is airtightly provided in the cylindrical section 71 and measures the pressure of the process space 37. The pressure sensor 72 transmits the measured value to the controller 9.

The controller 9 controls the operation of each section of the deposition apparatus 100 to perform a deposition method, which will be described later below. The controller 9 may be, for example, a computer or the like. A program of a computer that performs the operation of each section of the deposition apparatus 100 is stored in a storage medium. The storage medium may be, for example, a flexible disk, a compact disk, a hard disk, a flash memory, a DVD, or the like.

Conventionally, in a decompression CVD apparatus and a decompression ALD apparatus, in order to measure the pressure inside a process container, a pressure sensor, such as a capacitance manometer, is installed on the side wall of the process container to measure the pressure. However, in an ALD apparatus in which a process is performed by forming a narrow process space 37 between the mounting table 2 and the showerhead 3 in the process container 1 and enhancing the replaceability of gas, as in the above described deposition apparatus 100, and the pressure of the process space 37 cannot be measured precisely. Thus, because a process must be tried many times under different conditions in order to ensure process performance, it is difficult to secure process performance.

On the other hand, according to the deposition apparatus 100 of the embodiment, the deposition apparatus 100 includes the cylindrical section 71 that penetrates the showerhead 3 and communicates with the process space 37, and the pressure sensor 72 that is airtightly provided inside the cylindrical section 71 and measures the pressure of the process space 37. Thereby, it is possible to measure the pressure of the process space 37, i.e., the pressure in the vicinity of the wafer W, with high accuracy.

(Deposition Method)

Figure 7:
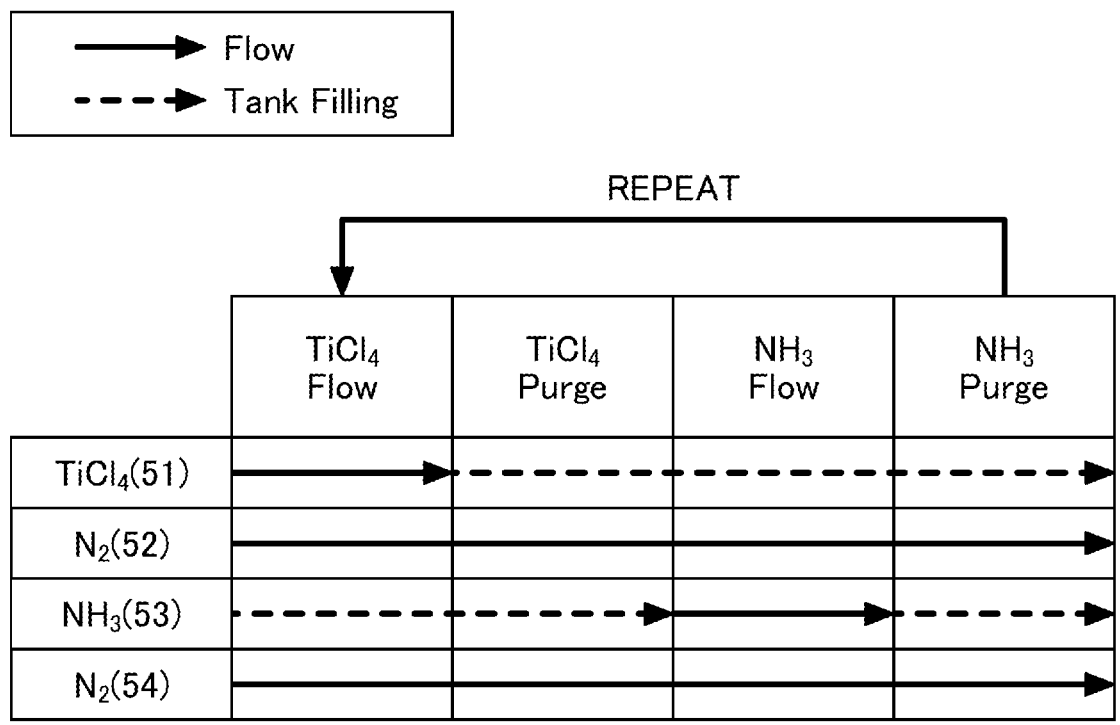
FIG. 7 is a diagram illustrating an example of a deposition method according to the first embodiment.

Referring to FIG. 7, an example of a deposition method according to an embodiment will be described. The deposition method according to the embodiment includes a carry-in step, a deposition step, and a carry-out step.

In the carry-in step, a wafer W is carried into the process container 1. In the carry-in process, the gate valve 12 is opened while the mounting table 2 is lowered to the transport position, and the wafer W is carried into the process container 1 by a transport robot (not illustrated) via the inlet/outlet 11, and is mounted on the mounting table 2 heated to a predetermined temperature by the heater 21. Subsequently, the mounting table 2 is lifted to the process position and the inside of the process container 1 is depressurized to a predetermined pressure.

The deposition step is performed after the carry-in step. In the deposition step, with a series of operations including a $TiCl_4$ supply step, a $TiCl_4$ purge step, a $NH_3$ supply step, and a $NH_3$ purge step as one cycle, the number of cycles is controlled to deposit a titanium nitride (TiN) film with a desired film.

The $TiCl_4$ supply step is a step of supplying $TiCl_4$ to the process space 37. In the $TiCl_4$ supply step, first, the valves 52V and 54V are opened and $N_2$ gas is continuously supplied from the purge gas sources 52S and 54S via the gas supply lines 52L and 54L. Further, by opening the valve 51V, $TiCl_4$ is supplied from the raw material gas supply section 51 via the gas supply line 51L to the process space 37. At this time, $TiCl_4$ is once stored in the storage tank 51T and then supplied into the process container 1. In the $TiCl_4$ supply step, the controller 9 controls the inside of the process space 37 to a desired pressure by controlling the pressure controller 62 based on the measured value of the pressure sensor 72.

The $TiCl_4$ purge step is a step of purging excess $TiCl_4$ and the like in the process space 37. In the $TiCl_4$ purge step, in a state of continuing to supply with the $N_2$ gas via the gas supply lines 52L and 54L, the valve 51V is closed to stop the supply of $TiCl_4$ from the gas supply line 51L.

The $NH_3$ supply step is a step of supplying $NH_3$ gas to the process space 37. In the $NH_3$ supply step, in a state of continuing to supply the $N_2$ gas via the gas supply lines 52L and 54L, the valve 53V is opened. This supplies the $NH_3$ gas from the nitride gas source 53S via the gas supply line 53L to the process space 37. At this time, $NH_3$ is once stored in the storage tank 53T and then supplied to the process container 1. The $NH_3$ supply step reduces $TiCl_4$ adsorbed on the wafer W. The flow rate of $NH_3$ at this time can be an amount for sufficiently causing the reduction reaction. Also, in the $NH_3$ supply step, the controller 9 controls the inside of the process space 37 to a desired pressure by controlling the pressure controller 62 based on the measured value of the pressure sensor 72.

The $NH_3$ purge step is a step of purging excess $NH_3$ and the like of the process space 37. In the $NH_3$ purge step, in a state of continuing to supply the $N_2$ gas via the gas supply lines 52L and 54L, the supply of $NH_3$ from the gas supply line 53L is stopped by closing the valve 53V.

As described above, with a series of operations including the $TiCl_4$ supply step, the $TiCl_4$ purge step, the $NH_3$ supply step, and the $NH_3$ purge step as one cycle, by controlling the number of cycles, a titanium nitride (TiN) film with a desired film can be deposited.

The carry-out step is performed after the deposition step is completed. In the carry-out step, the gate valve 12 is opened while the mounting table 2 is lowered to the transport position, and the wafer W is carried out by the transport robot (not illustrated) to the outside of the process container 1 via the inlet/outlet 11.

Also, when there is a wafer W to be processed next, the process returns to the carry-in step after the carry-out step, and the deposition step and the carry-out step are performed. This enables to deposit a TiN film with a desired thickness for the next wafer W.

According to the deposition method of the above described embodiment, the pressure controller 62 is controlled based on the measured value of the pressure sensor 72 provided airtightly inside the cylindrical section 71 that penetrates the showerhead 3 and communicates with the process space 37, thereby controlling the inside of the process space 37 to a desired pressure. Thereby, because it is possible to control the pressure in the vicinity of the wafer W with high accuracy, it is possible to easily realize a desired process performance.

Figure 2:
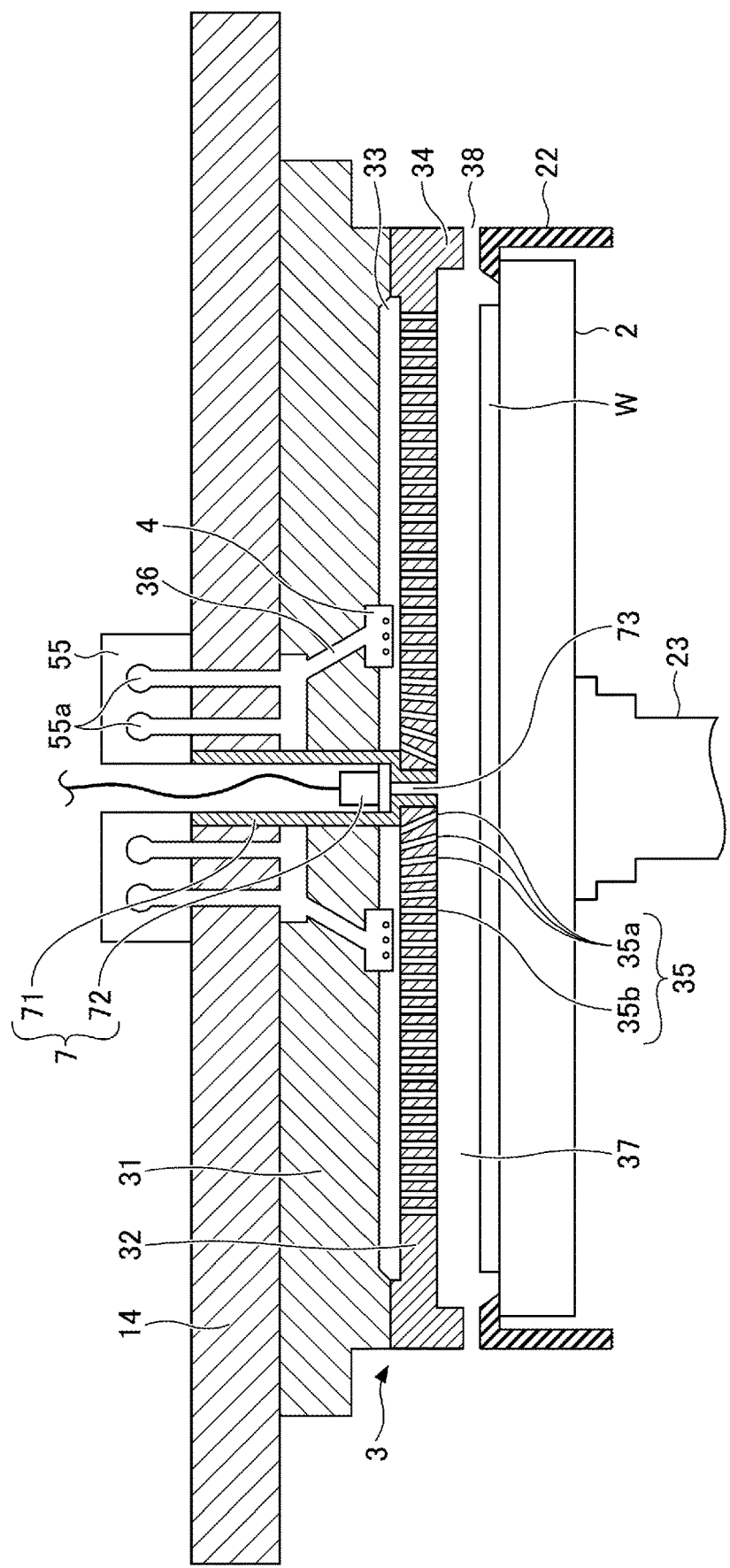
FIG. 2 is a cross-sectional view illustrating a showerhead of the deposition apparatus of FIG. 1.
Figure 3:
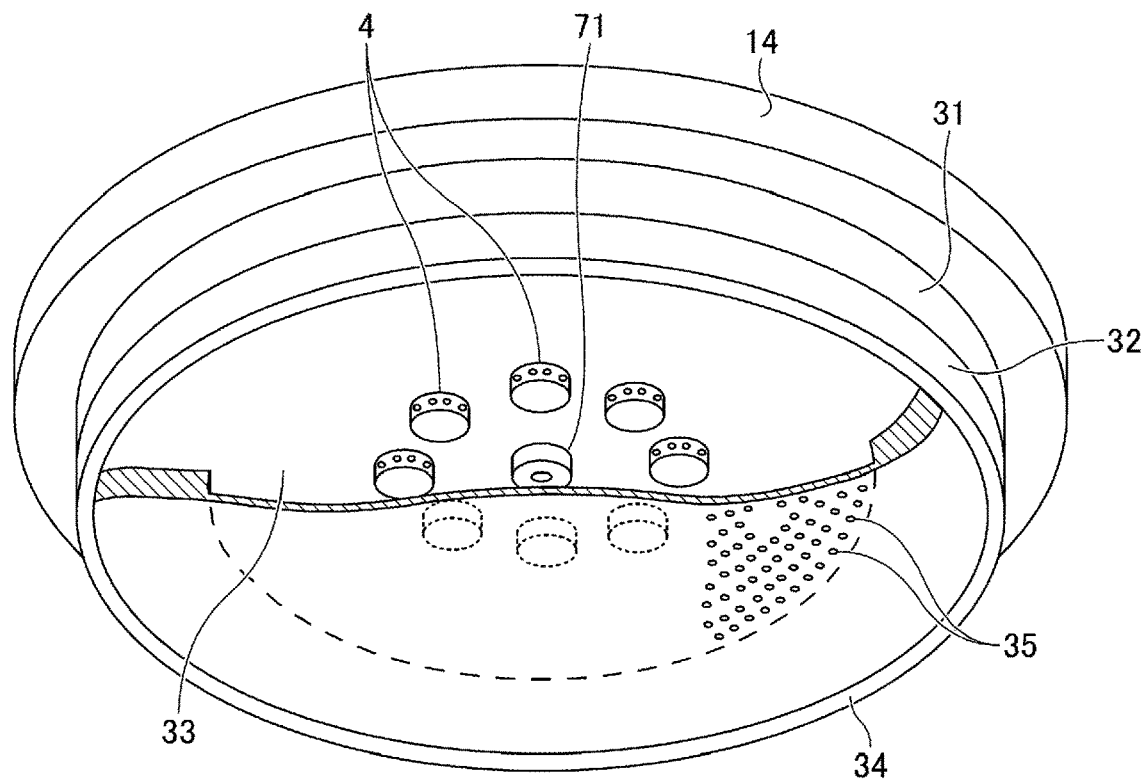
FIG. 3 is a perspective view illustrating the showerhead of the deposition apparatus of FIG. 1.

It should be noted that in the example illustrated in FIG. 2, there is a dead space 73 between the pressure sensor 72 and the surface of the showerhead facing the wafer W. However, from the viewpoint of suppressing staying/remaining gas, it is preferable that the pressure sensor 72 is arranged so that the pressure sensor 72 and the surface of the showerhead 3 facing the wafer W and are on the same plane.

Second Embodiment

Figure 8:
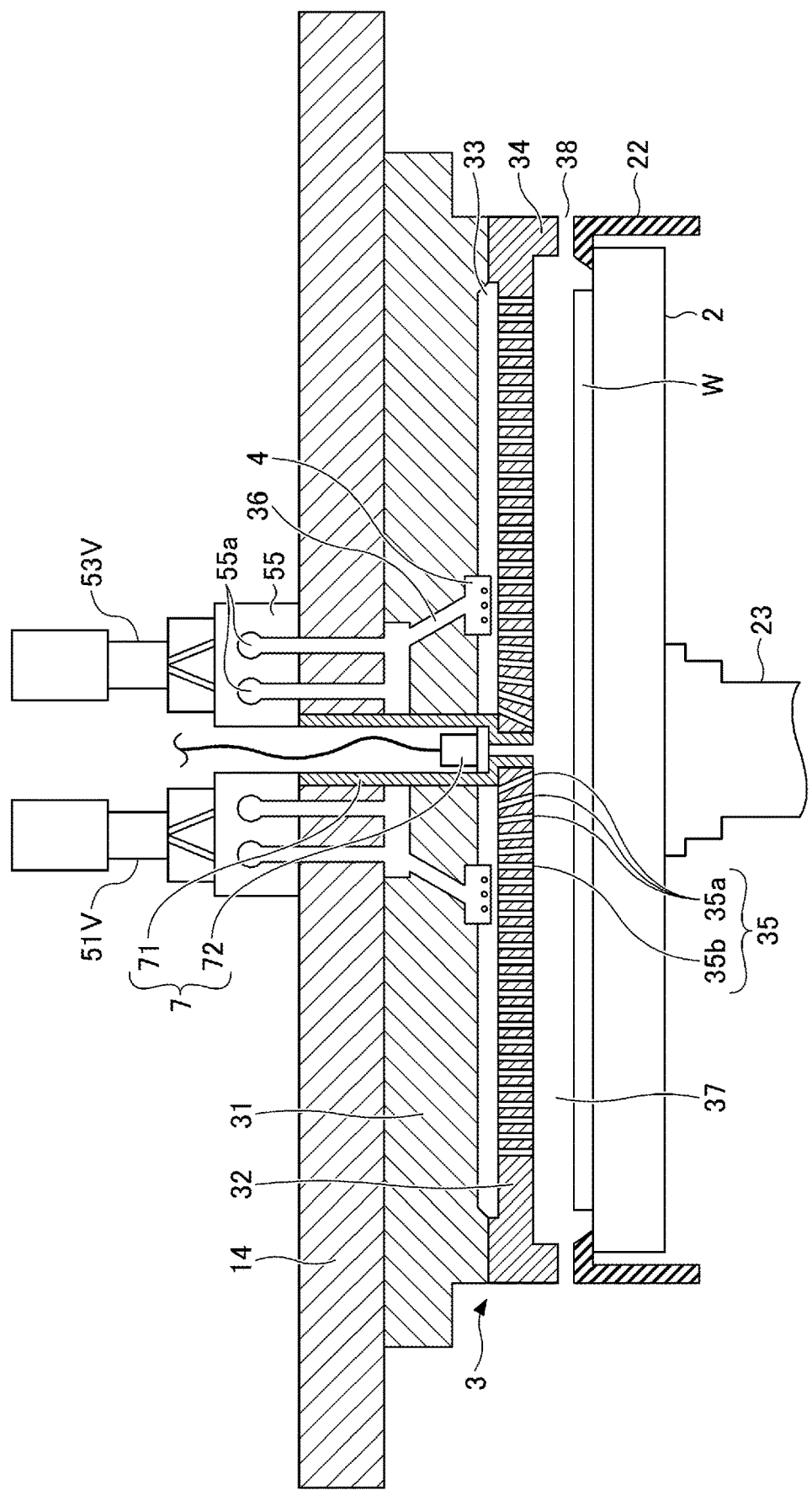
FIG. 8 is a cross-sectional view illustrating a showerhead of a deposition apparatus according to a second embodiment.
Figure 9:
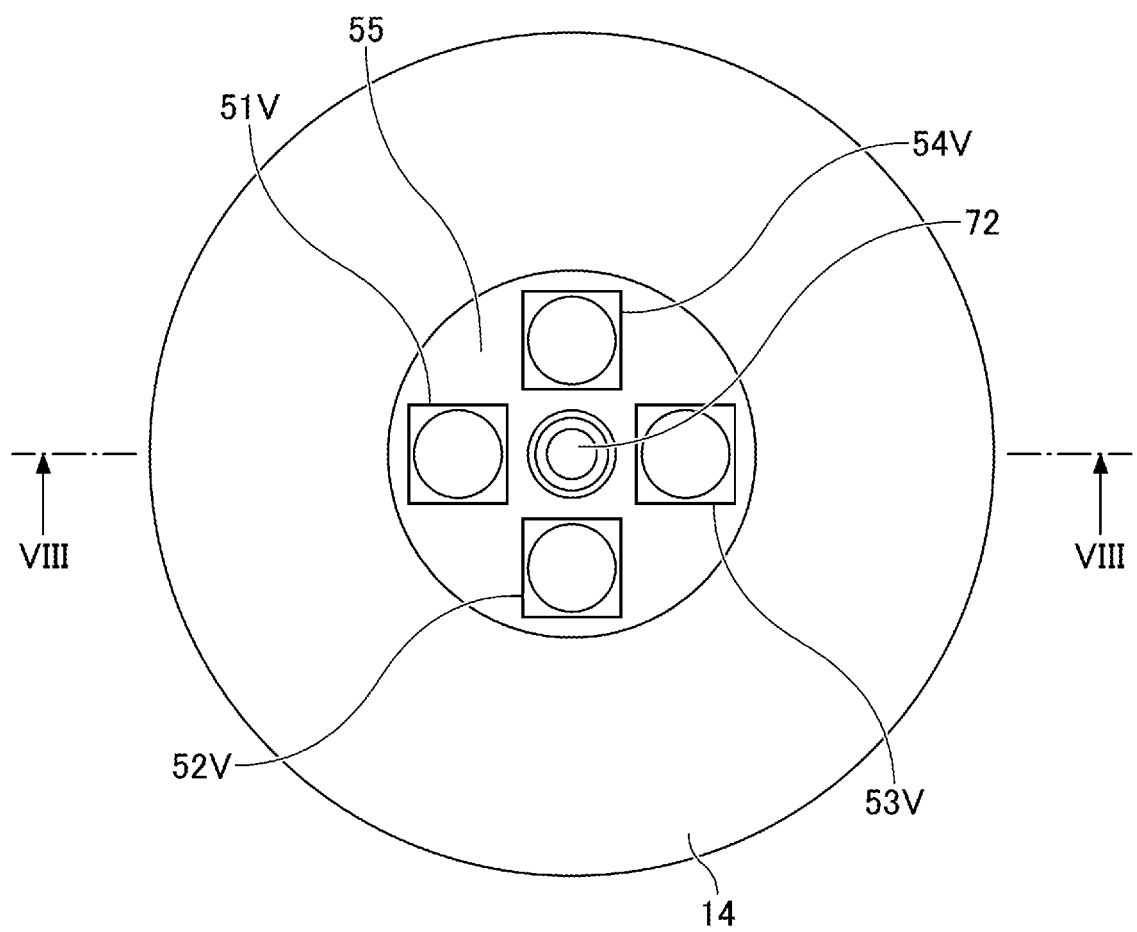
FIG. 9 is a plan view illustrating the showerhead of the deposition apparatus according to the second embodiment.

Referring to FIG. 8 and FIG. 9, an example of a deposition apparatus according to a second embodiment will be described. FIG. 8 is a schematic cross-sectional view illustrating an example of a showerhead of the deposition apparatus according to the second embodiment. FIG. 9 is a schematic plan view illustrating an example of the showerhead of the deposition apparatus according to the second embodiment. It should be noted that FIG. 8 illustrates a cross section cut at the alternate long and short dash line VIII-VIII in FIG. 9.

As illustrated in FIG. 8 and FIG. 9, the deposition apparatus 100A according to the second embodiment differs from the deposition apparatus 100 according to the first embodiment in that valves 51V to 54V are provided on the inlet block 55. The other configurations of the deposition apparatus 100A according to the second embodiment may have the same configuration as the deposition apparatus 100 according to the first embodiment.

According to the deposition apparatus 100A of the second embodiment, because the valves 51V to 54V are provided in the vicinity of the process space 37, it is possible to reduce the time lag (time delay) from when the opening valves 51V to 54V are opened to when the process gas is supplied to the process space 37. Further, because the distance from the valves 51V to 54V to the process space 37 can be shortened, the amount of gas remaining in the secondary gas path of the valves 51V to 54V after closing the valves 51V to 54V can be reduced. As a result, gas switching in the ALD process can be smoothly performed in a short period of time.

Examples

In Examples, the $TiCl_4$ partial pressure at the time of changing the supply timing of $TiCl_4$ when depositing a TiN film by the deposition method of the embodiment described above was compared.

In the ALD process, deposition is performed with switching the gas and the pressure in the process container 1 at a high speed, and it is necessary to supply the gas while the pressure in the process container 1 varies (pulses), therefore, the pressure of the raw material gas ($TiCl_4$) supplied to the reaction area (process space 37) also tends to be unsteady.

Figure 10:
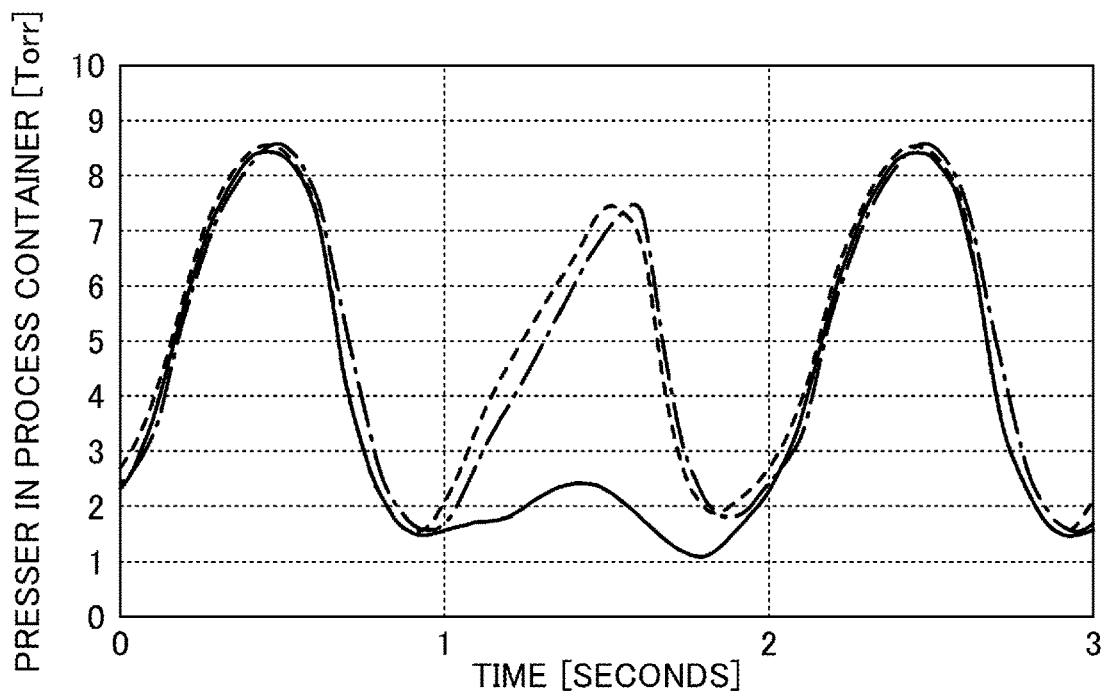
FIG. 10 is a diagram illustrating a time variation of a pressure in the process container.
Figure 11:
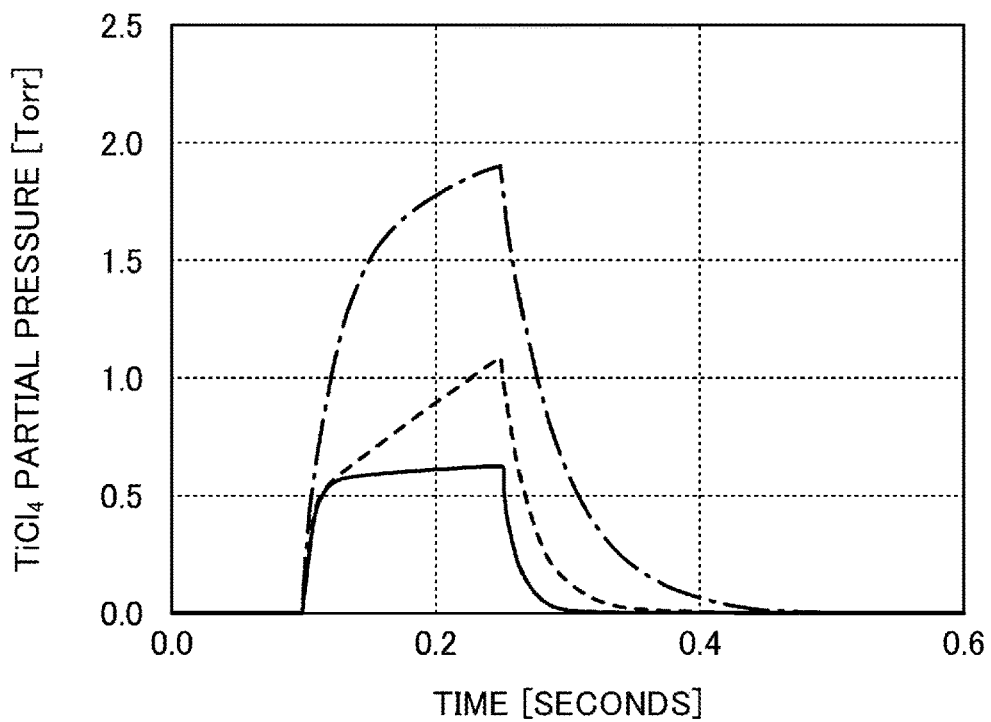
FIG. 11 is a diagram illustrating a time variation of a $TiCl_4$ partial pressure.

FIG. 10 is a diagram illustrating a time variation of the pressure in the process container 1. In FIG. 10, the horizontal axis indicates time [seconds] and the vertical axis indicates pressure [Torr] in the process container 1. FIG. 11 is a diagram illustrating a time variation of the $TiCl_4$ partial pressure. In FIG. 11, the horizontal axis indicates time [seconds] and the vertical axis indicates the $TiCl_4$ partial pressure [Torr]. In FIGS. and 11, the solid line, the broken line, and the alternate long and short dash line respectively indicate the results when $TiCl_4$ was supplied into the process container 1 at the point of time when the pressure in the process container 1 became 1.5 Torr (200 Pa), 3.0 Torr (400 Pa), and 5.0 Torr (667 Pa).

As illustrated in FIG. 10 and FIG. 11, in a case of supplying the raw material gas ($TiCl_4$) while the pressure in the process container 1 fluctuates, it is found that it is difficult to obtain the partial pressure of the raw material gas ($TiCl_4$) uniquely simply by monitoring the pressure in the process container 1. Therefore, it is considered important to install a pressure sensor on the showerhead and measure the pressure near the substrate in order to know the $TiCl_4$ partial pressure.

Figure 12:
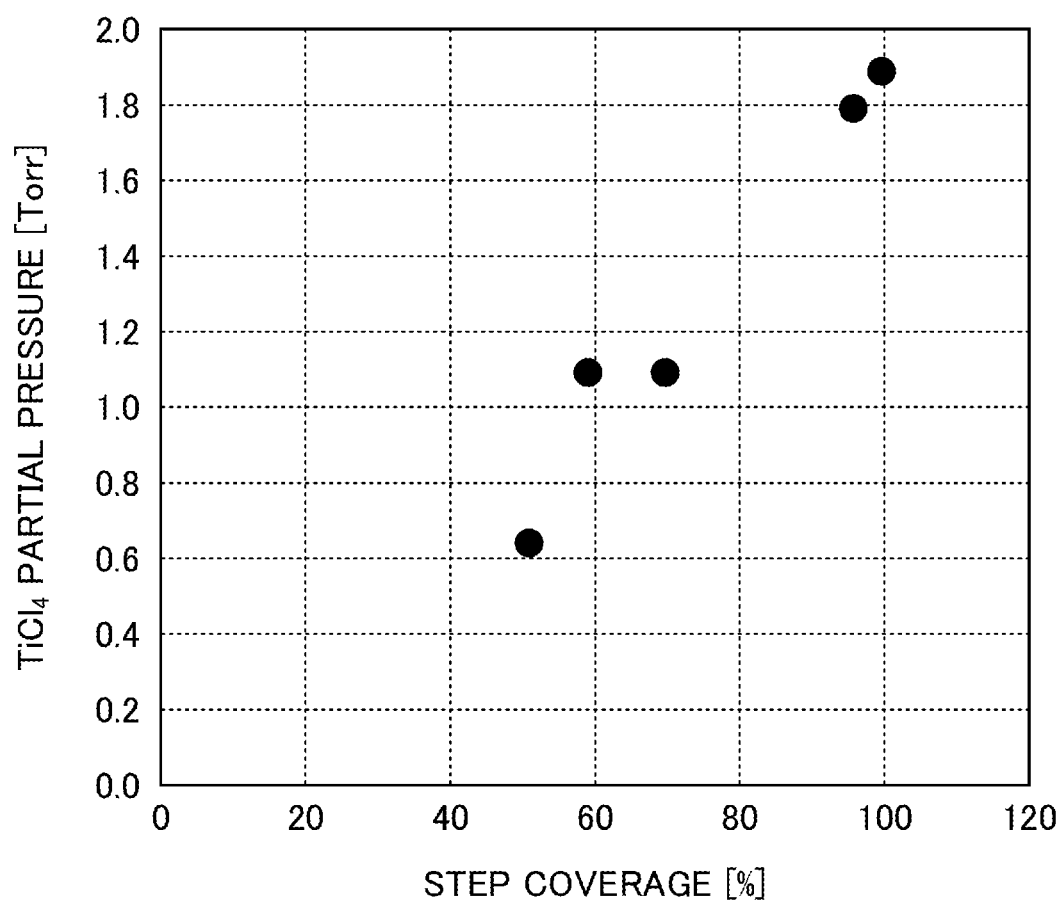
FIG. 12 is a diagram illustrating a relationship between a step coverage and the $TiCl_4$ partial pressure.

FIG. 12 is a diagram illustrating a relationship between the step coverage and the $TiCl_4$ partial pressure. In FIG. 12, the horizontal axis indicates the step coverage [%] when a TiN film was deposited on a pattern substrate on which a pattern containing a recess is formed, and the vertical axis indicates the $TiCl_4$ partial pressure [Torr].

As illustrated in FIG. 12, it is found that there is a positive correlation between the step coverage and the $TiCl_4$ partial pressure. From this result, it can be said that the step coverage can be increased by increasing the $TiCl_4$ partial pressure.

From the above results, it can be said that it is important to install a pressure sensor on the showerhead and measure the pressure near the substrate in order to grasp the process performance (e.g., step coverage).

The embodiments disclosed herein should be considered exemplary in all respects and are not limited thereto. The embodiments as described above may be, omitted, substituted, and changed in various forms without departing from the appended claims and spirit thereof.

In the embodiments described above, the cylindrical section and the pressure sensor are provided at the center of the showerhead, but the present disclosure is not limited thereto. For example, a cylindrical section and a pressure sensor may be provided other than the center of the showerhead. For example, cylindrical sections and pressure sensors may be provided at a plurality of locations within the plane of the showerhead. This enables the pressure distribution to be measured in the plane of the substrate.

Although an ALD apparatus that alternately and intermittently supplies $TiCl_4$ gas and $NH_3$ gas to deposit a TiN film has been described in the embodiments described above, the present disclosure is not limited to this, and the present disclosure is also applicable to an ALD apparatus that utilizes other gases to deposit other films.

What is claimed is:

1. A deposition apparatus comprising:
    a process container which is decompressable;
    a showerhead configured to supply a gas in the process container, the showerhead including an upper member and a lower member, said lower member having a plurality of gas holes, a diffusion space formed between the upper member and the lower member and said diffusion space diffuses the gas;
    said diffusion space being located between the upper member and lower member of the showerhead to diffuse the gas; the lower member is connected to a bottom of the upper member;
    a mounting table arranged to face the showerhead and to form a process space between the mounting table and the showerhead;
    the lower member is located directly between the diffusion space and the process space;
    the plurality of gas holes extend in the lower member from a diffusion space side toward a process space side;

a cylindrical section that penetrates the showerhead and communicates with the process space; the cylindrical section being provided at a center of the showerhead; and a pressure sensor that is provided in the cylindrical section at the center of the showerhead and configured to measure a pressure in the process space, the pressure sensor being arranged such that a lower surface of the pressure sensor and the bottom of the upper member of the showerhead are on a same plane, wherein the lower surface of the pressure sensor and the bottom of the upper member of the showerhead both face a surface of the mounting table that is configured to hold a wafer, and wherein the plurality of gas holes of the lower member are disposed around the cylindrical section; and wherein an inside of the cylindrical section is separate from the diffusion space.

2. The deposition apparatus according to claim 1, wherein the plurality of gas holes include a plurality of inclined holes, and an inclination angle of the plurality of inclined holes increases in accordance with proximity to the center of the cylindrical section.

3. The deposition apparatus according to claim 1, wherein the plurality of gas holes include a plurality of non-inclined holes that do not have an inclination from a side of the diffusion space toward a side of the process space.

4. The deposition apparatus according to claim 1, further comprising:
a pressure controller configured to control the pressure in the process container; and
a controller configured to control the pressure controller based on a measured value of the pressure sensor.

5. The deposition apparatus according to claim 1, further comprising:
an inlet block having a cylindrical shape that is provided on the upper member so as to surround the cylindrical section to introduce the gas to the diffusion space.

6. A deposition method that is performed by a deposition apparatus comprising:
a process container which is decompressable;
a showerhead configured to supply a gas in the process container, the showerhead including an upper member and a lower member, said lower member having a plurality of gas holes,
a diffusion space formed between the upper member and the lower member and said diffusion space diffuses the gas; said diffusion space being located between the upper member and lower member of the showerhead to diffuse the gas; the lower member is connected to a bottom of the upper member;
a mounting table arranged to face the showerhead and to form a process space between the mounting table and the showerhead;
the lower member is located directly between the diffusion space and the process space;
the plurality of gas holes extend in the lower member from a diffusion space side toward a process space side;
a cylindrical section that penetrates the showerhead and communicates with the process space; the cylindrical section being provided at a center of the showerhead; and a pressure sensor that is provided in the cylindrical section at the center of the showerhead and configured to measure a pressure in the process space, the pressure sensor being arranged such that a lower surface of the pressure sensor and the bottom of the upper member of the showerhead are on a same plane, wherein the lower surface of the pressure sensor and the bottom of the upper member of the showerhead both face a surface of the mounting table that is configured to hold a wafer, and wherein the plurality of gas holes of the lower member are disposed around the cylindrical section; and wherein an inside of the cylindrical section is separate from the diffusion space;

wherein the deposition method comprises:
performing a carry-in step, where the wafer is carried into the process container;
performing a deposition step, where a film is deposited on the wafer; and
controlling the pressure in the process container based on a measured value of the pressure sensor.

7. The deposition apparatus according to claim 1, wherein the plurality of gas holes include a plurality of inclined holes, and an inclination angle of the plurality of inclined holes increases in accordance with proximity to the center of the cylindrical section such that the gas is discharged below the cylindrical section.

8. The deposition apparatus according to claim 1, wherein the plurality of gas holes include a plurality of inclined holes, and an inclination angle of the plurality of inclined holes increases in accordance with proximity to the center of the cylindrical section such that the gas is discharged to a space between the cylindrical section and the mounting table.

* * * * *